United States Patent [19]

Cox

[11] 4,030,029
[45] June 14, 1977

[54] HARNESS ASSEMBLY TEST SYSTEM

[76] Inventor: C. Eugene Cox, 2738 W. Strawberry Lane, Santa Ana, Calif. 92701

[22] Filed: Aug. 14, 1975

[21] Appl. No.: 604,821

[52] U.S. Cl. ................................. 324/66; 29/755; 29/593; 29/705
[51] Int. Cl.² ................. G01R 31/02; G01R 19/16
[58] Field of Search ..................... 324/51, 66, 73; 29/203 MW, 593

[56] References Cited

UNITED STATES PATENTS

| | | | |
|---|---|---|---|
| 3,250,992 | 5/1966 | Cronkite et al. | 324/66 |
| 3,407,480 | 10/1968 | Hill et al. | 324/66 X |
| 3,440,531 | 4/1969 | Jasorka et al. | 324/66 |
| 3,521,161 | 7/1970 | Kurata et al. | 324/66 |
| 3,600,673 | 8/1971 | Kohke | 324/66 X |
| 3,609,538 | 9/1971 | Schag | 324/66 |
| 3,705,347 | 12/1972 | Tuller | 324/66 |
| 3,902,026 | 8/1975 | Rogers et al. | 324/66 X |

Primary Examiner—Gerard R. Strecker
Attorney, Agent, or Firm—Grover A. Frater

[57] ABSTRACT

A wiring harness in which each of a number of conductors is to have a first end connected at a first place and its other end connected to a respectively associated second place is produced by applying an initiating signal to one of the first places. All of the first places are examined in sequence and the sequencing is stopped when an initiating signal is found. An indication is provided at the second place which corresponds to the first place at which sequencing is stopped. Then, unless previously done, a conductor is connected with its first end at said first place and the other end of that conductor is connected to the corresponding second place whereupon the indication is terminated and the sequencial examination continues.

That method may be practiced with an apparatus which is connected between all first places and second places and which "looks" at pairs of first and second places in sequence. When an operator selects a first place, or a conductor whose first end is connected to that first place and touches it with a signal source, a lamp is illuminated at the second place at which the second end of the conductor is to be connected. The lamp is extinguished when the connection of the conductor is complete.

21 Claims, 4 Drawing Figures

U.S. Patent  June 14, 1977  4,030,029
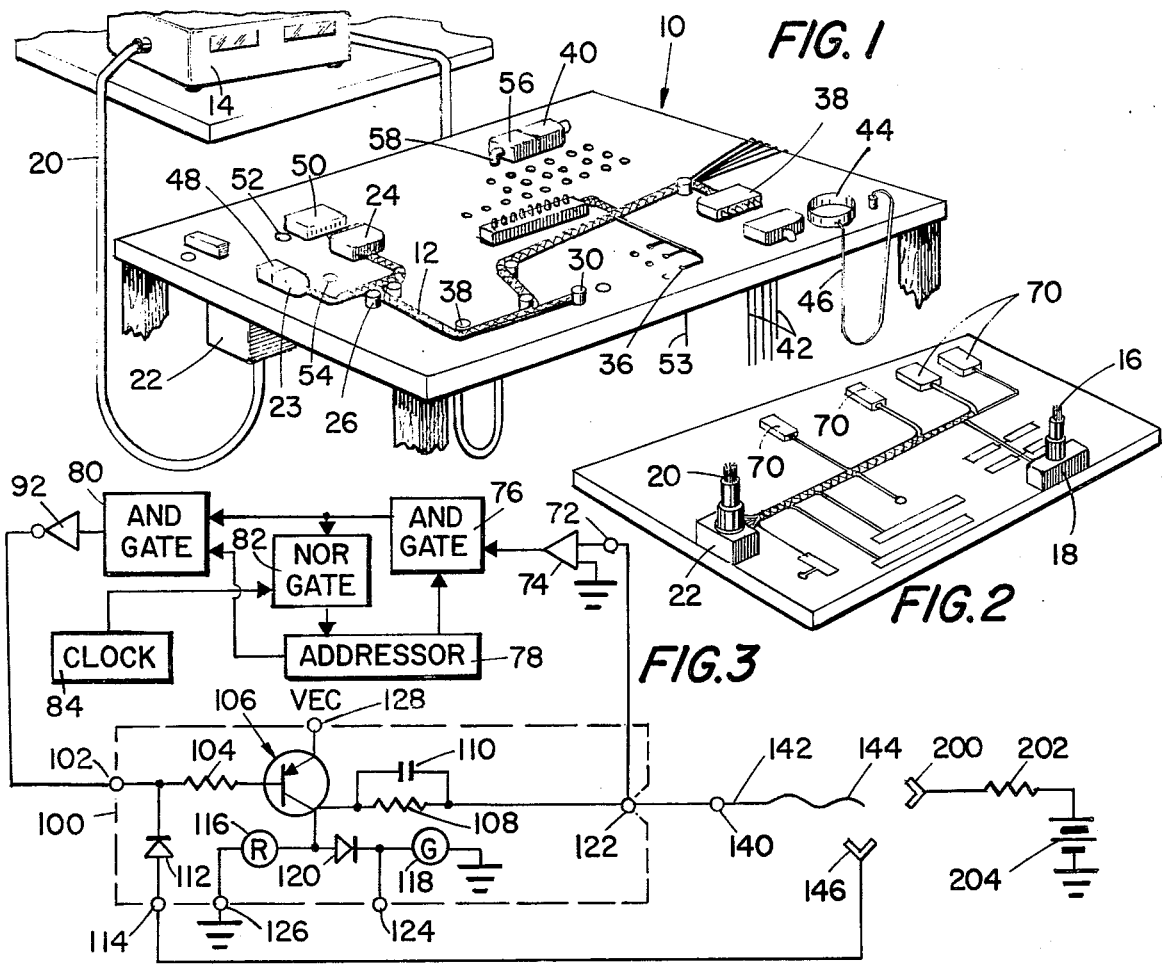
FIG. 1
FIG. 2
FIG. 3
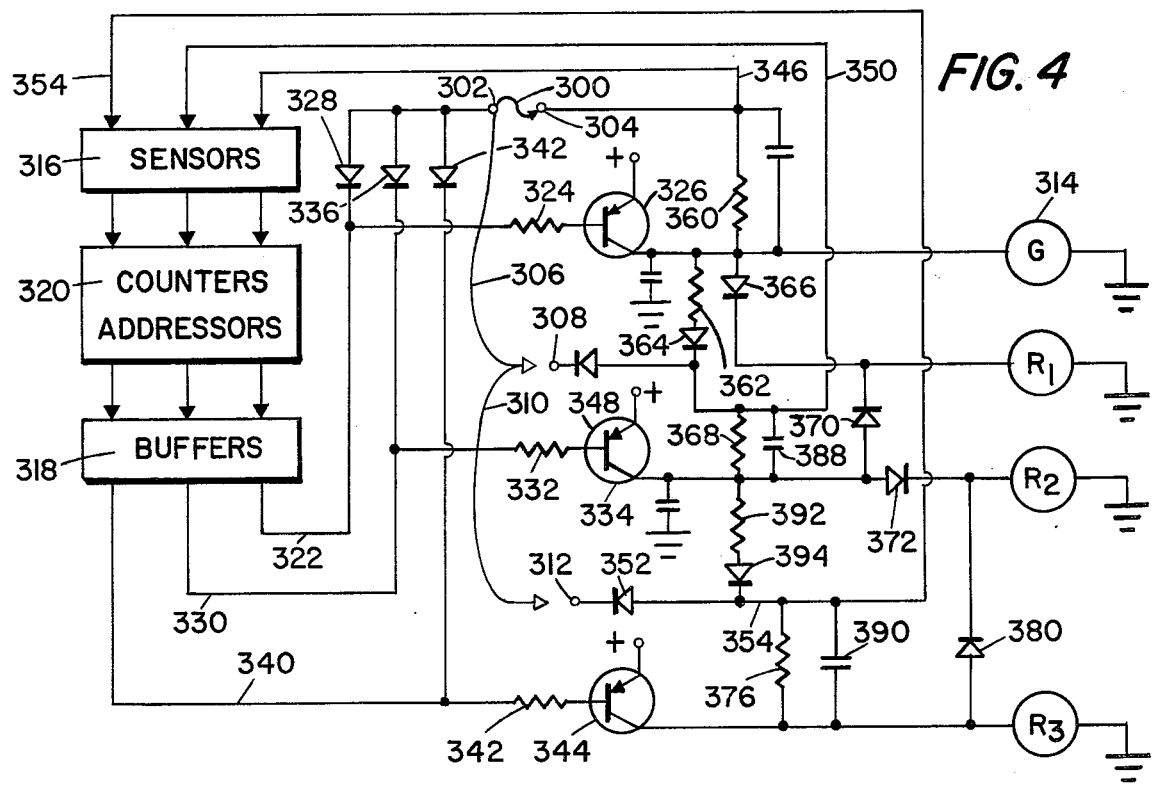
FIG. 4

HARNESS ASSEMBLY TEST SYSTEM

This invention relates to improvements in methods and means for making electrical wiring harnesses. While not limited thereto, the invention relates to methods and means for making complex harnesses which may incorporate hundreds of separate conductor wires.

BACKGROUND

The term "wiring harness" is usually employed to describe a structure of conductor wires which structure is produced separately from the apparatus in which it will ultimately be incorporated. That is, the term is ordinarily not used to describe wiring that is formed in situ in the chassis in which it will be used. The several wire ends that are incorporated in a harness may be left unconnected so that they can be connected to terminals within the chassis after the harness is installed. Or they are connected to a terminal. That terminal may be an individual one, or it may be one of many terminals that are housed together in a connector which is to mate with another connector once it is installed as a component in the unit for which it was made. It is usual for each connector and for each terminal and for each wire to be given an individual identifier. That identifier can be a name or a letter or a number or a color. Each wire extends from a first place to a second place, and for convenience here, the end of the wire that terminates at the first place is called the "first end" and the end that terminates at the second place is called the "second end".

When a number of substantially identical wiring harnesses are to be produced, it is usual to produce them on a structure called a "harness forming board" or something similar. The forming board may or may not be flat. In any event, its shape is arranged so that conductor wire can be fastened to it temporarily, one at a time, so that each end of each wire begins and ends at a place that corresponds to the points at which those wires are to be connected when the harness is removed from the board and placed in the apparatus for which it is made. Wiring harnesses are often very complex. They may consist of hundreds of wires and many connectors, and the connectors may be spaced from one another in many different directions.

The construction of a complex wiring harness is often tedious, and may present many opportunities for error.

SUMMARY OF THE INVENTION

It is a primary object of the invention to reduce the opportunity and likelihood of error in the construction of wiring harnesses. It is an object to reduce the labor involved in creating a wiring harness, and it is an object to make it unnecessary that the wires be connected in any particular, predefined sequence. That last object is particularly important. Much time is saved and much opportunity for error is eliminated if there is no need for the assembler to look for a specific wire to put in a specific place. In the invention, the operator need only touch the second end of any wire at random and, without identifying that wire by number or color, or anything else, know where it is to be connected. The connection point is automatically indicated by a display.

In practicing the method of the invention, each wire of the harness has its first end placed at and fixed to the place at or to which it will ultimately be connected. That activity is an initial step and is usually called "preforming". That term implies that the "first end" of the preformed wire has been fixed to the terminal or connector to which it will ultimately be attached. When the terminal or connector does not form part of the wiring harness so that the wire to which it will be attached is left unconnected, it is customary to refer to the wire as a "lay-in" wire.

Thus it is that the first end of the preformed wires are placed in the relative position that they will occupy in the finished harness. It is preferred, and usually essential, that a forming board be provided on which the harness will be constructed. That supporting structure, in the preferred manner of practicing the invention, carries connectors of the kind that will mate with the connectors to which the preformed, or first ends of the conductors, are attached. For example, if a harness is to include a male connector with 50 pins, then the forming board will have the corresponding female connector mounted on the board in the same relative position that the male connector is to occupy in the finished harness. For each connector to be included in the finished harness, there is a corresponding mating connector on the board. In the case of the lay-in wires, the board will include a connector at both the first and second end position of the wire.

At that stage of the process, some or all of the conductor wires that are to make up the harness have an individual terminal connected to their first ends or their first ends have been connected to a multiple connector structure. Moreover, all of the connectors and terminal structures at the first ends of all of those wires are connected to mating conductors and fasteners and terminals that are carried by the harness forming board. In the invention, some indicia is displayed at the points where the respective second ends of those conductor wires are to terminate. While not essential, it is preferred that a display also be presented in the vicinity of first end of the wire. In the preferred form of the invention, the display comprises a lamp, and in one embodiment, a green lamp is placed in the vicinity of the first end of each conductor wire and a red lamp is placed in the vicinity of the point at which each conductor wire is to terminate. In the example above, up to 50 conductor wires are terminated at the 50 pin connector. That connector is mated during the wire harness construction process with a 50 terminal connector which is fixed to the form board. A green lamp is mounted on the board near that fixed connector, and it serves to mark the first end of all 50 of the conductors. Those 50 conductor wires each have a second end, and the second end of each conductor wire is to be brought to a second place on the form board. In the preferred form of the invention, a separate lamp is used to mark every second place. If a number of conductor wires are to be connected to a single multiple pin connector unit, the lamps at the second place may be arranged in a pattern similar to the pin pattern of the conductor, or some other means may be employed to indicate the specific point at which the second end of each conductor is to be connected or temporarily fastened. Except that the completed harness may include previously constructed sub-harnesses, the assembly person completes the task by routing the conductor wires, one at a time, from their respective first ends and first places to the respectively associated second places. The assembler is confronted by what may be hundreds of conductor wires, some of which may not be connected at either end, but which more often are fastened to the form board at one end, but which are otherwise loose. The conductors have individual insulating jackets and the second end of each wire will have been stripped away in a preparatory step.

In practicing the invention in the preferred form, the assembly person carries a terminal which he or she connects to one of the first places either directly or by touching the second end of a conductor, the first end of which was previously connected to that first place. All of the first places are examined in sequence for the presence of an electrical potential that appears on the assembler's terminal. When the terminal, being touched, is examined in its turn, coincidence of examination and touching is made the signal for illuminating the lamps described above or some other kind of indicia. That incidia is displayed physically at the position or "second place" which is associated with the first place being touched and at which the second end of the wire is to be placed. In the preferred method, another indicia is displayed at the first place corresponding to that second place, displaying indicia at both the first place and the second place. If the assembler's body is connected by an arm band or something similar to the electrical potential source, then merely touching a finger to the second end of a conductor will result in a display of indicia which indicates the position of the first and second end of the wire being touched.

The first ends of all of the wires can be connected in sequence to the potential source manually, but the advantage of the invention rises when potential supply is connected to those first ends in sequence rapidly and automatically so that the sequence is completed in a moment and is immediately repeated over and over. As soon as the supply is connected to a first end of which the assembler has connected the second end, the sequencing action is interrupted. In the preferred method, that is made the occasion for displaying the indicia and for keeping it displayed until the connection of that conductor wire is completed, even if, in the process, the assembler removes the second end of the wire from the power source. The purpose of the display is to let the assembler know where it is that the second end of the wire is to be attached. In the method, attaching the second end of the wire to its proper termination is made the occassion for terminating display of the indicia. Except in the case of lay-in wires, the second end of each wire is to be terminated at a connector. When that termination has been accomplished and the connector has been mated with the mating connector that forms part of the board, then the second end will have been properly terminated and the indicia is no longer displayed.

That apparatus is arranged in a preferred embodiment of the invention so that it tests for the presence of an initiating signal at one end while it has connection to, or is related to, the corresponding second end. That requires only a moment of time. Thereafter, it makes contact with another first end and its corresponding second end momentarily. Thereafter, it makes contact with still another first end and its corresponding second end momentarily. That process continues until contact has been made with all of the first and second ends in sequence. In the preferred form of the invention, no connection effective to apply a signal at the second place is accomplished by that control apparatus unless an initiating signal of a certain kind appears at the first end. However, whether a structure of that kind or some other kind is used is not important in the method of the invention.

In the preferred apparatus for practicing the invention, the sequencing apparatus that connects to, or "looks at" pairs of first and second places in sequence completes a connection between the first place and the second place of a pair when it senses a potential of a given kind and magnitude at the first place.

"Completes a connection" means that an output signal is applied to a second place if an initiating signal is then being applied to the corresponding first place. Having completed that connection, sequencing is stopped until the potential signal at the first place is terminated. Completion of the connection operates to close a switch which is effective to continue the application of the initiating signal at the first place, and it also applies electrical power to the indicia which is located adjacent to the corresponding second place. Also, if there is one, it applies power to the indicia which is located in the vicinity of the first place. The switch is arranged so that it will open if a conductor wire is connected between the first place at which the signal is being applied and the corresponding second place. To do that, the sequencing control apparatus is made to be sensitive to one kind of a signal, an initiating signal, and insensitive to another kind, an inverse signal. Having received an initiating signal, the sequencing control apparatus developes an inverse signal and applies it to the second place. The switch is made to close when it receives an inverse signal. Retracing that loop, if an initiating signal is applied to one of the first places of the form board, the sequence controller will ultimately connect to that first place, and on receiving that initiating signal will stop sequencing. It will apply an inverse signal to the associated second place. The inverse signal is effective to actuate the switch and the switch is effective to continue application of the initiating signal and to illuminate the indicia lamps. That situation continues until the harness assembler completes connection of a conductor wire between that first place and second place. When that wire has been installed, the inverse signal will have been applied via that conductor wire to the input of the sequence controller, or the reverse, initiating signal will be applied to the switch to reverse the switch. Thereupon, the connection from the first place to the second place through the sequence controller will be terminated and will resume sequencing until the assembler touches the second end of another conductor wire.

In the preferred form of the invention, the sequencing is accomplished so rapidly that the appropriate indicia lamp is reached and illuminated almost immediately after the corresponding conductor wire has been touched.

In the drawings:

FIG. 1 is an isometric view of a form board connected to a sequencing control unit and on which a wiring harness is partially formed;

FIG. 2 is an isometric drawing of the underside of the form board of FIG. 1;

FIG. 3 is a schematic drawing of that portion of the sequencer control unit and that portion of the form board wiring that is associated with one of the conductor wires of a harness together with the circuit that is connected to the assembler while the harness is being made;

FIG. 4 shows a modification of the arrangement of FIG. 3.

In FIG. 1, the numeral 10 generally designates the form board on which a partially completed wiring harness 12 is being assembled. The form board is connected to a sequencing control unit 14. That unit includes sensor amplifiers, counters and addressors, and buffer amplifiers. The input circuits of the sensor amplifiers constitute the several inputs of the sequencer controller 14. Those inputs are connected to the form board 10 by a multiple wire input cable 20. The cable is connected to the form board at a terminal box 22 which is fixed to the underside of the board and visible in FIGS. 1 and 2. The output terminals of the several buffer amplifiers in unit 14 are connected by a multiple wire cable 16 to a terminal box 18 at the underside of the form board 10. Box 22 is visible in FIG. 2.

In the example shown in the drawings, the harness 12 is not particularly complex. For the sake of clarity, a harness with only a few dozen conductors, rather than hundreds, has been selected. All of its conductor wires are connected at their respective first ends to one or the other of two multiple pin male connectors, 23 and 24. They are routed along predetermined paths which may be drawn on the form board and marked by locator pins. In this case, all of the conductor wires extend from one or the other of connectors 23 and 24 to a common route between the two locator pins 26 around locator pin 28, and some others. One of those conductor wires terminates at a connector terminal 30. Many others terminate at a multiple pin connector 32. Some of them terminate at individual temporary fastening elements at one edge of the board where one of them is identified by the reference numeral 36. Other of those conductor wires terminate in a multiple pin male connector 38. Still others, not yet assembled, remain to be connected to a multiple pin electrical connector 40. Those conductors are shown draped over the right hand edge of the form board awaiting connection to the connector 40. For identification, that group wires is designated by the reference numeral 42.

During the course of the assembly work, the assembly person wears an arm band 44 which is connected to a source of an electrical potential by way of conductor cable 46 and ultimately, the multiple wire cable 16.

All of the input wires in input cable 20 are connected to one or the other of female connector units 48 and 50 which mate with male connectors 23 and 24 respectively. When connectors 24 and 50 are mated, as connectors 23 and 48 are shown to be, then the terminals of connectors 23 and 24 to which the conductor wires are attached are called "first places". Each terminal to which a wire is to be attached is called a first place and there is an electrical circuit from that connector through the combination of the connectors 24 and 50, and 23 and 48, and terminal in box 22 and wires in cable 20 to a respectively associated sensor amplifier in the sequencing controller 14. When the sequencing controller is operating, it "looks at" each terminal of connectors 23 and 24 in sequence, and on completion of the sequence, it begins again and continues over and over to look at all of the terminals in sequence.

There is a green lamp 52 next to the connector 50, 24. There is another green lamp mounted on the board adjacent to the combination of connectors 23, 48. when the assembler, wearing armband 44, touches the bare end of one of the conductor wires 42, a potential will be applied to that wire. The other end of that wire will be connected to one or the other of the connector sets, 23, 48 or 24, 50. The green light associated with the connector set to which that connector is attached will be illuminated. For example, wire 53 is one of the group of wires 42 that may be seen hanging over the end of form board 10 in FIG. 1. That wire 53 extends back through the partially completed harness. Let it be assumed that its first end is connected to one of the terminals of the male connector unit 23. If the assembly person touches the bare end of wire 53, called the second end, while wearing the armband 44, a potential, a positive potential in this case, will be applied to wire 53 and ultimately, to one of the sensor amplifiers in unit 14. The sequence controller rapidly scans through all of the input terminals by connecting to them individually and momentarily through their respective sensor amplifiers. When connection is made of the sensor amplifier whose input can be traced back to wire 53, then green light 54 will be illuminated if the operator is touching wire 53.

Not only in green light 54 illuminated, but red light 55 adjacent to the connector 40 will also be illuminated. The red lamp 55 is one of a group of red lamps mounted on the form board adjacent to connector 40 and its mating connector 56. The lamps of the group are placed such that they represent the arrangement of terminals in connector 40. All of the terminals in connector 40 are connected through the mating connector 56 and multiple wire conductor 58 and terminal unit 18 and multiple wire cable 16 to the output circuits of a respectively associated one of the buffer amplifiers in unit 14. Because red lamp 55 is illuminated, the assembler knows that the conductor wire 53 is to be connected to that terminal of connector 40 which is indicated by the physical position of red lamp 55 in the set of lamps of which it is a part. The combination of red lamp 55 and green lamp 54 will continue to glow, notwithstanding that the assembly person removes his contact with the bare end of the insulated conductor wire 53. The lamps will remain illuminated until the free end of conductor 53 is connected to the appropriate terminal in connector 40 and connector 40 is mated with its companion connector 56. When that connection is completed, both lamps 54 and 55 will be extinguished, and that is the sign to the assembler that the task has been properly accomplished. If connection has been made to the wrong terminal in connector 40, then a connection will have been completed to the wrong input sensor amplifier in unit 14 and the lamps will not be extinguished. Since the lamp is not extinguished, the assembler knows that the wire 53 has been improperly terminated.

Since some of the conductor wires of the group 42 may have their first ends connected to connector 24, touching the second ends of those wires will not result in illumination of the lamp 52 or any red lamp because connector 24 is not mated with connector 50. Before work can proceed, the first end of the conductor wires must be connected to the first place. Connector 24 must be mated with connector 50.

The switch and its related circuitry, including the lamps, is called the lamp driver and feedback circuit, sometimes simply the lamp driver circuit.

There is a lamp driver circuit for each conductor in the completed harness, and in most cases, all of the lamp driver circuits are mounted on the form board. In FIG. 2, the cabinets, or sub-chassis, 70 house the lamp driver circuits.

A lamp driver circuit is shown in FIG. 3 where it is bounded by the dashed lines and is designated by the reference numeral 100. The output terminal 122 of the lamp driver circuit is connected to an input terminal 72 of a circuit which is shown schematically and which is representative, functionally, of the kind of circuit that is contained in unit 14 of FIG. 1. Terminal 98 is one of the output terminals and is connected to a lamp driver input terminal 102.

In FIG. 3, input terminal 72 is connected to the input of an amplifier 74 whose output is connected to one of the inputs of an AND gate 76. The other input of that AND gate is taken from the output of an addressor unit 78. The output of the addressor unit also is applied to one input of a second AND gate 80, whose other input is supplied by the output of AND gate 76. Output from the AND gate 76 is also applied to one input of a NOR gate 82 whose other input is supplied by a clock 84. The output of the NOR gate is applied as an input signal to the addressor 78. Finally, the output of AND gate 80 is applied to an inverting amplifier 92 whose output is applied to a terminal 102 of the lamp driver circuit 100.

Amplifiers 74, 92 and AND gates 76, 80 are duplicated for each lamp driver circuit. The addressor 78 and the clock 84, and, in part, the NOR gate 82 serve all of the lamp driver circuits. The function of those several elements is to apply a logical low to terminal 102 at the output of amplifier 92 when a positive signal is applied at the terminal 72. Conversely, the function is to apply a logical high at terminal 102 in the absence of a positive potential at terminal 72. The addressor 78 has output connection to the AND gates associated with all of the lamp driver circuits and it responds to clock signals from clock 84 through the NOR gate 82 to apply signals to the AND gates corresponding to AND gates 76 and 80 of each lamp driver circuit, in sequence. If, during that sequencing process, the addressor applies a signal to an AND gate 76, or the corresponding gate of another lamp driver circuit, when that AND gate is subjected to a signal at its other input, then the addressor stops sequencing until the signal input to the other terminal in the AND gate is terminated.

In the particular case of FIG. 3, if a positive potential is applied at terminal 72, amplifier 74 will apply a signal to one input of gate 76. Sequencing is done very rapidly in the preferred form of the invention and, unless the addressor has been stopped by the application of a positive signal in another circuit, it will shortly apply an input signal to the other terminal of the AND gate 76. When that occurs, an output will appear at the output line 77 of AND gate 76 and that output will be applied to the NOR gate 82. The NOR gate will apply a signal to the addressor to prevent further sequencing. The addressor 78 continues to apply a signal to one of the inputs of both the gates 76 and 80. The output of AND gate is 76 is applied to the other input of the AND gate 80 so an output signal is applied to amplifier 92. The output of the amplifier 92 is inverted and becomes a logical low and that logical low is applied to terminal 102, and it results in closure of the "switch" of the lamp driver circuit. The lamp driver circuit 100 includes a bias input terminal 102, a base resistor 104, a PNP transistor 106, a feedback resistor 108, a by-pass capacitor 110, an isolating diode 112, a "second end" terminal 114, a red lamp 116, a green lamp 118, an isolating diode 120, an output terminal 122, an intercircuit terminal 124, and two supply terminals. One supply terminal 126 connects to system ground or common. The other, 128, is connected to a potential source $V_{EC}$ at the side away from the common. In this case, terminal 128 is positive relative to ground.

The lamp driver circuit is traced as follows: Input terminal 102 is connected to the base of transistor 106 through resistor 104. It also is connected to "second end" terminal 114 through diode 112 from cathode to anode. The emitter of the transistor 106 is connected to supply terminal 128. The collector is connected through the parallel combination of resistor 108 and capacitor 110 to output terminal 122. The collector is also connected to ground terminal 126 through the red lamp 116. The collector is also connected to ground through the series combination of diode 120, from anode to cathode, and green lamp 118. The intercircuit terminal 124 is connected to the junction between diode 120 and green lamp 118. Resistor 104 has a relatively low value, such for example as 390 ohms. On the other hand, resistor 108 has a very high value. In one example, its resistance is 10 megohms.

If the signal applied to input terminal 102 is a logical high, the transistor 106 will be turned off. No current will flow from supply terminal 128 through the transistor so the lamps 116 and 118 will not be lit. If, however, the signal at input terminal 102 becomes a logical low, then base current will flow and the transistor 106 will be turned on. Current will flow from supply terminal 128 through the transistor 106 from emitter to collector and it will flow through the red lamp 116 to ground so that that lamp will be lit. Current will also flow through the diode 120 from anode to cathode and through the lamp 118 to ground so that both the green and the red lamps will be lit. Some current will flow from the collector of transistor 106 through resistor 108 to output terminal 122, and from there to the input circuit of the sensor amplifier that is associated with lamp driver circuit 100. The switching unit 14 is arranged so that when that unit "interconnects", the output terminal 122 and the input terminal 102, the logical low at input terminal 102 will be maintained. Thus, current flow through the resistor 108 and output terminal 122 serves as a positive feedback current that keeps the circuit locked on as long as the switch unit 14 "interconnects" terminal 122 and terminal 102. The gates are sensitive to the fact that that feedback current exists and are arranged so that connection continues as long as the feedback current continues.

Terminal 102 is subjected to a logical low. Thereafter, if the output terminal 122 is connected to the "second end" terminal 114, a negative potential will be applied to terminal 122 through diode 112. Terminal 122 connects to input terminal 72. That is equivalent to loss of the initiating or input signal. In response, the switching unit 14 causes the output signal at terminal 102 to become a logical high. As a consequence, the lamps 116 and 118 will be extinguished.

Terminal 122 is connected to a "first end" terminal 140 which is external to the lamp driver circuit. That first end terminal is connected to a wire 142 which corresponds to one wire of group 42 in FIG. 1. The wire 142 is accessible and can be moved and it has a second end 144. If that second end is touched to the assembler's terminal 200 of the external circuit which extends from terminal 200 through a limiting resistor 202, and the positive side of a voltage source 204 whose other side is connected to system ground or common, then a positive potential or initiating signal will be applied to terminal 122 and to the sensor 74 which is associated with it.

A number of variations of the basic arrangement are possible. One important variation is shown in FIG. 4 where the task is to connect a wire 300 from terminal 302 to terminal 304. Another wire 306 is to be connected from terminal 302 to terminal 308. Finally, a wire 310 is to be connected from terminal 308 to terminal 312. Arrangements of that kind are referred to in the art as "daisy chains".

Green lamp 314 is located physically near the terminal 302. The red lamps R-1, R-2 and R-3 are located physically near terminals 304, 308 and 312, respectively. In FIG. 4, the block marked SENSORS includes a number of sensors such as the sensor amplifier 74 and gate 76 in FIG. 3. The box 316 includes one sensor for each red lamp circuit. The output of those sensors are connected to the input or respectively associated buffers, similar to amplifier 92 and gate 80 in FIG. 3. The set of buffers is identified by the reference numeral 318 in FIG. 4 and the legend BUFFERS.

The function of the box marked ADDRESSORS, 320, is to connect each sensor in succession to its respectively associated buffer. The arrangement in FIG. 3 is representative of one section of that unit. That particular arrangement is not essential to successful practice of the invention. The function of the ADDRESSORS unit is to interconnect each sensor to its respectively associated buffer in sequence. Having interconnected every sensor with its associated buffer, the unit begins over again. It operates continuously until it has interconnected a sensor with its buffer at the time when a logical high is applied to the input of that sensor. When that occurs, the ADDRESSOR unit stops. The sensor to which a high is applied remains connected to its buffer until the input of the sensor in switched to a low as an incident to completion of the connection whose ends are being indicated by the test loop circuit associated with that sensor.

The diagram of FIG. 4 assumes that there are three sensors and three buffers. Output line 322 of one buffer is connected through a resistor 324 to the base of a transistor 326, and through an isolating diode 328 to the first end, or green end of terminal 302. The output 330 from another buffer is connected through a resistor 332 to the base of a transistor 334, and to the first end terminal 302 by way of an isolating diode 336. The output line 340 from the third buffer is connected through a resistor 342 to a transistor 344 and by a diode 342 to that same first end terminal 302. The emitter of each transistor is connected to a source of positive potential. In the case of transistors 326 and 334, the collector is connected through a capacitor to ground.

Terminal 304 is connected to a first sensor by a line 346. Terminal 308 is connected through an isolating diode 348 to the input of the second sensor by line 350. Finally, terminal 312 is connected through a diode 352 to the third sensor by a line 354. The collector of transistor 326 is connected by a resistor 360 to line 346 and it is connected by the series combination of a resistor 362 and a diode 364 to line 350. The collector of transistor 326 is also connected to one side of green lamp 314 whose other side is connected to ground. The collector of transistor 326 is also connected through a diode 366 to one side of red lamp R-1 whose other side is connected to ground.

The collector of transistor 334 is connected by a resistor 368 to line 350 and it is connected by a diode 370 to the junction between diode 366 and lamp R-1. The collector of transistor 334 is also connected through a diode 372 to one side of red lamp R-2 whose other side is connected to ground. Further, the collector is connected to line 354 through the series combination of resistor 392 and diode 394.

The collector of transistor 344 is connected by a resistor 376 to line 354 and to one side of a red lamp R-3 whose other side is connected to ground. In addition, the collector of transistor 334 is connected by a diode 380 to the junction between diode 372 and red lamp R-2.

In preparing the materials for the wiring harness which is to be constructed using the circuitry of FIG. 4, one end of conductor 300 will have been connected to terminal 304 near the green lamp 314. Let it be assumed that the operator is wearing an armband which is connected to a source of positive potential relative to system ground and that the operator touches the other end of wire 300. When that happens, a positive charge is applied to the first sensor by line 346. When the ADDRESSORS unit 320 connects that sensor to the respectively associated buffer of BUFFER unit 318, a low will be applied by line 322 to the base of transistor 326. The transistor will be turned on and the green lamp 314 and the red lamp R-1 will be illuminated in the manner described in connection with FIG. 3. A feedback voltage will be applied to line 346 through resistor 360 and those lamps will remain illuminated even though the assembler lets go of the end wire 300. Red lamp R-1 is located adjacent terminal 302.

If the operator completes the connection of wire 300 to terminal 302, a negative potential will be applied to terminal 304 through diode 328. Terminal 304 is connected to line 346 and the first sensor. The sensor will be turned off. The output of the associated buffer will go high. Transistor 326 will be turned off. The green light 314 will have been extinguished. However, the red light R-1 does not go off. During the time when transistor 326 was conducting, a positive voltage was applied through resistor 362 and diode 364 and line 350 to the second sensor. However, because the connection was completed between the first sensor of the SENSORS unit 316, and the first buffer of the buffers unit 318, the ADDRESSORS unit 320 stop counting whereby the second sensor is not interconnected with the second buffer. Moreover, during the period when transistor 326 was conducting a charge was accumulating on capacitor 388 and that charge will be dissipated through resistor 368 to maintain line 350 and the input of the second sensor amplifier high, notwithstanding that the operator touches nothing. The ADDRESSORS unit 320 switches through the sensors and buffers so rapidly that the second sensor and the second buffer will have been connected prior to the time when the capacitor 388 is discharged. As a consequence, a signal will appear at line 330 and that signal applied to the base of transistor 334 will turn on that transistor causing current to flow to charge capacitor 390 and to illuminate lamp R-1 through diode 370 and to illuminate red lamp R-2 through diode 372. Red lamp R-1 is located adjacent terminal 302 and red lamp R-2 is located adjacent terminal 308. The operator knows then to connect a wire from terminal 302 to terminal 308. Having connected that wire, wire 306 in FIG. 4, a circuit will have been completed from line 330 through diode 336, terminal 302, wire 306, terminal 308, diode 348 and line 350 to apply a low to the input of the second sensors. As a consequence of that, transistor 334 will be turned off. As a result, no current will flow through rectifier 370 and lamp R-1 so that that lamp is extinguished.

However, red lamp R-2 is not extinguished. Capacitor 390 discharges through resistor 376 to apply a logical high to the input of the third sensor by line 354. Before the capacitor 390 is discharged, ADDRESSORS unit 320 will have interconnected the third sensor of unit 316 with the third buffer of unit 318. A logical low will appear on line 340 to turn on transistor 344 whose output is applied to red lamp R-2 through rectifier 380. Consequently, lamp R-2 remains lit. Some of the current through the transistor flows through red lamp R-3 to ground so that it illuminates that lamp as well. If the operator completes the connection of wire 310 from terminal 308 to terminal 312, then the third sensor input will be subjected to a negative potential by completion of a connection from the third buffer via line 340 and diode 342 and terminal 302 and lines 306 and 310, and terminal 312 and diode 352 and line 354 to the input terminal of the third sensor. When that occurs, the transistor 344 is cut off and lamps R-2 and R-3 are extinguished.

Although I have shown and described certain specific embodiments of my invention, I am fully aware that many modifications thereof are possible. My invention, therefore, is not to be restricted except insofar as is necessitated by the prior art.

I claim:

1. The method of making a wiring harness of the kind in which each conductor of a group of conductors, each having a first end and a second end, is to extend from a respectively associated first place at which a respectively associated electrically conductive element is located to a respectively associated second place at which a respectively associated electrically conductive element is located, which method comprises the steps of:
   applying an initiating signal to the electrically conductive element at one of said first places;
   sequentially examining the conductive elements at said first places for the presence of an initiating signal;
   terminating said sequential examination upon finding a conductive element at a first place which is subjected to an initiating signal;
   providing an indication to identify the second place associated with the first place which is subjected to said initiating signal; and
   terminating said initiating signal and said indication by completing connection of said one conductor such that its first end is connected to the conductive element at the first place at which the initiating signal appeared and such that its second end is connected to the conductive element at the associated second place.

2. The method defined in claim 1 including the step of identifying the first place when its conductive element is subjected to said signal and when the second place associated therewith is being identified.

3. The method defined in claim 1 in which said initiating signal is applied by touching either one of the conductive elements at a first place or the second end of its respectively associated conductor to a point having a selected electrical potential.

4. The method defined in claim 3 in which said second end of a conductor is touched by a person who is subjected to the selected electrical potential.

5. In a wire harness production apparatus, in combination:
   an apparatus having a plurality of input terminals and a plurality of output terminals associated with said input terminals, respectively, said apparatus further comprising sensor means for causing an output signal to appear at each of said output terminals when a given signal appears at its respectively associated input terminal;
   a plurality of first electrically conductive places and a plurality of second electrically conductive places associated with said first places, respectively, and having an indicating means associated with each second place, respectively, operable to provide an indication;
   connecting means for connecting said input terminals to respectively associated ones of said first places; and
   operating means responsive to said output signals for operating the indicating means associated with the second place which is associated with the input terminal at which a signal appears; and
   reversing means responsive to interconnection of said first place and said second place for reversing said indicating means.

6. The invention defined in claim 5 which further comprises means for providing input signals to said input connectors as an incident to application of a potential thereto and for maintaining said potential until the first and second places associated with said input are interconnected.

7. The invention defined in claim 5 in which said energizing means comprises a switch and a source of potential and means comprising said switch, responsive to the appearance of an output signal at one of said output terminals for applying said potential to the indicating means and the input terminal associated with said one of said output terminals.

8. The invention defined in claim 7 in which said switch comprises a transistor having its base connected in circuit with said one of said output terminals.

9. The invention defined in claim 5 in which said apparatus having a plurality of input terminals and output terminals further comprises means for examining said input terminals in sequence until one input terminal is found at which a signal appears and which thereupon ceases sequential examination and applies an output signal to the output terminal associated with said one input terminal.

10. The invention defined in claim 9 which further comprises a plurality of electrical conductors each having a first end and a second end, the first end of each conductor of said plurality being connected to a respectively associated one of said first places.

11. The invention defined in claim 10 in which said energizing means comprises a potential source and a plurality of switches each connected to complete a circuit from said source to respectively associated ones of said first places and to respectively associated ones of said indicators when a signal appears at the respectively associated ones of said output terminals.

12. The invention defined in claim 11 which comprises means for operating each switch to terminate application of potential to the first place associated with said switch upon connection of said first place associated with said switch to said second place associated with said first place.

13. The invention defined in claim 12 which further comprises an electrically energizable indicator associated with each first place and connected for energization by the switch associated with its respectively associated first place.

14. The invention defined in claim 13 further comprises means responsive to completion of the connection from a given first terminal and its given second terminal for operating the switch associated with said given first and second terminals for disconnecting said potential from said given first terminal and for causing another of said switches to apply a potential to the first terminal associated with said other switch.

15. In a wire harness production apparatus in which a first end of a conductor is to be connected at an electrically conductive first place and in which a second end of said conductor is to be connected at a second electrically conductive place, means for providing a display at said second place upon subjecting said first place to a given signal and for terminating said display upon completion of said connections comprising, in combination:
a first electrically conductive place and a second electrically conductive place, and an indicator;
a circuit path for energizing said indicator;
sensor means responsive to application of a given signal at said first place for completing said circuit path until termination of said given signal; and
means responsive to completion of a connection from said first place to said second place for terminating application of said given signal at said first place.

16. The invention defined in claim 15 which further comprises means responsive to application of said given signal to said first place for maintaining said given signal at said first place until completion of said connection from the first place to the second place.

17. The invention defined in claim 15 in which said sensor means comprises means sensitive to presence of an input potential of one polarity to provide an output signal of opposite polarity;
said circuit path being completed in response to the presence of said output signal;
said means responsive to completion of said connection from said first place to said second place comprising means for applying said output signal to said seond place whereby said output signal of opposite polarity is applied to said sensor means upon completion of said connection.

18. The invention defined in claim 17 in which said circuit path comprises a switch and means for connecting said switch and said first place in series connection across a source of electrical potential, said switch being responsive to the presence of said output signal for completing said series connection such that said first place is subjected to said potential of one polarity.

19. The invention defined in claim 18 in which said switch comprises a semiconductor having a control electrode and a main current path which opens upon application of potential of said opposite polarity to said control electrode; and
in which said first place is connected through an impedence element to a point in said circuit path at which a potential of said one polarity is experienced upon opening of said main current path.

20. The invention defined in claim 20 which further comprises means independent of opening of said main current path for applying a potential of said one polarity to said first place.

21. The invention defined in claim 20 in which said second place is connected to said control electrode through an isolating diode.

* * * * *